United States Patent
Gao et al.

(10) Patent No.: US 8,344,421 B2
(45) Date of Patent: Jan. 1, 2013

(54) GROUP III-NITRIDE ENHANCEMENT MODE FIELD EFFECT DEVICES AND FABRICATION METHODS

(75) Inventors: Xiang Gao, Edison, NJ (US); Shiping Guo, Hillsborough, NJ (US)

(73) Assignee: IQE RF, LLC, Somerset, NJ (US)

( * ) Notice: Subject to any disclaimer, the term of this patent is extended or adjusted under 35 U.S.C. 154(b) by 245 days.

(21) Appl. No.: 12/778,011

(22) Filed: May 11, 2010

(65) Prior Publication Data

US 2011/0278644 A1 Nov. 17, 2011

(51) Int. Cl.
*H01L 29/66* (2006.01)

(52) U.S. Cl. ......... 257/192; 257/E29.091; 257/E21.441; 438/285

(58) Field of Classification Search ............... 257/192, 257/E29.091, E21.441; 438/285
See application file for complete search history.

(56) References Cited

U.S. PATENT DOCUMENTS

| | | |
|---|---|---|
| 2004/0041169 A1 | 3/2004 | Ren et al. |
| 2006/0006414 A1 | 1/2006 | Germain et al. |
| 2007/0228416 A1 | 10/2007 | Chen et al. |
| 2007/0278518 A1 | 12/2007 | Chen et al. |
| 2008/0006845 A1 | 1/2008 | Derluyn et al. |
| 2008/0090345 A1 | 4/2008 | Robinson et al. |
| 2008/0258243 A1 | 10/2008 | Kuroda et al. |
| 2008/0296618 A1 | 12/2008 | Suh et al. |
| 2008/0308813 A1 | 12/2008 | Suh et al. |
| 2009/0072240 A1 | 3/2009 | Suh et al. |
| 2009/0072272 A1 | 3/2009 | Suh et al. |
| 2009/0146182 A1 | 6/2009 | Hikita et al. |
| 2009/0146185 A1 | 6/2009 | Suh et al. |
| 2009/0189187 A1 | 7/2009 | Briere et al. |
| 2009/0191674 A1 | 7/2009 | Germain et al. |

FOREIGN PATENT DOCUMENTS

EP  1 612 866 A2  1/2006

OTHER PUBLICATIONS

C.S. Suh et al., "p-GaN/AlGaN/GaN Enhancement mode HEMTs", Device Research Conference, pp. 163-164 (Jun. 2006).

Y. Cai et al., "Control of threshold voltage of AlGaN/GaN HEMTs by fluoride-based plasma treatment: From depletion mode to enhancement mode," IEEE Trans. Electron Devices, vol. 53, No. 9, pp. 2207-2215 (Sep. 2006).

C.Y. Chang et al., "Development of enhancement mode AlN/GaN high electron mobility transistors," Applied Physics Letters, vol. 94, Issue 26, id. 263505 (3 pages) (2009).

(Continued)

*Primary Examiner* — N Drew Richards
*Assistant Examiner* — Yu-Hsi D Sun
(74) *Attorney, Agent, or Firm* — Fish & Richardson P.C.

(57) ABSTRACT

Structures and fabrication processes are described for group III-nitride enhancement mode field effect devices in which a two-dimensional electron gas is present at or near the interface between a pair of active layers that include a group III-nitride barrier layer and a group III-nitride semiconductor layer. The barrier layer has a band gap wider than the band gap of the adjacent underlying semiconductor layer. The two-dimensional electron gas is induced by providing one or more layers disposed over the barrier layer. A gate electrode is in direct contact with the barrier layer. Ohmic contacts for source and drain electrodes are in direct contact either with the barrier layer or with a semiconductor nitride layer disposed over the barrier layer.

67 Claims, 12 Drawing Sheets

OTHER PUBLICATIONS

W.B. Lanford et al., "Recessed-gate enhancement-mode GaN HEMT with high threshold voltage," Electronics Letters, vol. 41, No. 7, (Mar. 2005).

K. Takatani et al., "A novel AlGaN/GaN filed-effect diode with a low turn-on voltage operation using fluoride-based plasma treatment," CS MANTECH Conference, 4 pages (Apr. 14-17, 2008).

N. Ikeda et al., "A novel GaN device with thin AlGaN/GaN heterostructure for high-power applications," Furukawa Review, No. 29, pp. 1-6 (2006).

C. Ostermaier et al., "Ultrathin InAlN/AlN narrier HEMT with high performance in normally off operation," IEEE Electron Device Letters, vol. 30, No. 10, pp. 1030-1032 (Oct. 2009).

H. Yue et al., "Development and characteristic analysis of enhancement-mode recessed gate AlGaN/GaN HEMT," Sci China Ser E-Tech Sci, vol. 51, No. 6, pp. 784-789 (Jun. 2008).

T. Fujiwara et al., "Enhancement-mode m-plane AlGaN/GaN heterojunction filed-effect transistors," Applied Physics Express 2, 011001, 2 pages (2009).

Y Liu, "Enhancement-mode quaternary AlInGaN/GaN HEMT with non-recessed-gate on sapphire substrate," Electronics Letters, vol. 42, No. 15, 3 pages (Jul. 2006).

R. Wang et al., "Enhancement-mode $Si_3N_4$/AlGaN/GaN MISHFETs," IEEE Electron Devices, vol. 27, No. 10, pp. 793-795 (Oct. 2006).

J.S. Jur et al., "Epitaxial rare earth oxide growth on GaN for enhancement-mode MOSFETs," CS MANTECH Conference, 4 pages (Apr. 14-17, 2008).

T. Palacios et al., "High-performance e-mode AlGaN/GaN HEMTs," IEEE Electron Device Letters, vol. 27, No. 6, pp. 428-430 (Jun. 2006).

Y. Cai et al., "High-performance enhancement-mode AlGaN/GaN HEMTs using fluoride-based plasma treatment," IEEE Electron Device :etters, vol. 26, No. 7, pp. 435-437 (Jul. 2005).

Y. Cai, et al., "Monolithic integration of enhancement- and depletion-mode AlGaN/GaN HEMTs for GaN digital integrated circuits," IEDM Tech. Dig., pp. 771-774 (2005).

GROUP III-NITRIDE ENHANCEMENT MODE FIELD EFFECT DEVICES AND FABRICATION METHODS

FIELD OF THE DISCLOSURE

The disclosure relates to group III-nitride enhancement mode field effect devices.

BACKGROUND

Enhancement mode field effect devices are normally-off devices, in which no current flows between the source and drain contacts unless a positive voltage is applied to the gate. Such field effect devices include, for example, high electron mobility transistors (HEMTs) that have a two-dimensional electron gas (2DEG) between two active layers (e.g., between an GaN layer and a AlGaN layer) deposited on a silicon carbide (SiC) or sapphire substrate. This two-dimensional electron gas layer is a result of spontaneous and piezoelectric polarization leading to charge separation within the materials.

In some field effect devices, the two-dimensional electron gas is present at zero gate bias as a result of the characteristics of the materials. Most GaN field effect transistor (FET) devices with contacts on top of the AlGaN layer are normally-on devices due to the fact that certain a thickness of AlGaN barrier is needed for high conductivity connecting the source and drain of a FET. A particular negative voltage, called the threshold voltage, must be applied to the gate to deplete the two-dimensional electron gas through capacitive coupling. By applying a negative voltage to the gate, the electron channel can be pinched off. This negative voltage is typically below some negative threshold voltage (Vth). These transistors operate in depletion mode (i.e., the channel has to be depleted to switch off the transistor). For some applications, such as power switching or integrated logic, a negative-polarity gate voltage supply is undesirable.

In contrast to depletion mode devices, field effect transistors with a positive threshold voltage are normally-off devices such that at zero gate voltage, no channel is present to conduct current. These transistors operate in enhancement-mode, which can be useful for normally-off power switches, digital electronics applications, and high efficiency RF applications.

To make a normally-off device, the channel under the gate contact can be interrupted selectively while at the same time preserving a two-dimensional electron gas density in the other regions. A positive threshold voltage applied to the gate will then induce a two-dimensional electron gas under the gate contact, allowing current to flow between source and drain.

Various techniques have been proposed to obtain enhancement mode field effect devices. For example, one proposed structure uses an ultrathin InAlN/AlN barrier between the gate and the channel. See Ostermaier et al., "Ultrathin InAlN/AlN Barrier HEMT With High Performance in Normally Off Operation," IEEE Electron Device Letters, vol. 30, no. 10, pp. 1030-1032 (October 2009). As disclosed in this article, the enhancement mode HEMT structure includes a 1-nm lattice-matched InAlN barrier with an additional 1-nm AlN interlayer, which results in a 2-nm thin barrier over a GaN buffer. The structure is capped with a highly doped n++ GaN layer. An enhancement mode device is achieved by selectively etching the GaN cap layer to form a recess for the gate metallization and leaving a 2-nm barrier between the gate and the channel.

SUMMARY

Structures are described for group III-nitride enhancement mode field effect devices in which a two-dimensional electron gas is present at or near the interface between a pair of active layers that include a group III-nitride barrier layer and a group III-nitride semiconductor layer. The barrier layer has a band gap wider than the band gap of the adjacent underlying semiconductor layer and is thin enough that the two-dimensional electron gas is depleted if no additional material is disposed over the barrier layer. The two-dimensional electron gas can be induced by providing one or more designated layers over the barrier layer. A gate contact is in direct contact with the barrier layer. Ohmic contacts for the source and drain are in direct contact, for example, either with the barrier layer or with a semiconductor nitride layer disposed over the barrier layer.

Fabrication processes are described for the various enhancement mode field effect devices.

Other features and advantages will be apparent from the following detailed description, the accompanying drawings and the claims.

DETAILED DESCRIPTION OF THE DRAWINGS

Figure 1:
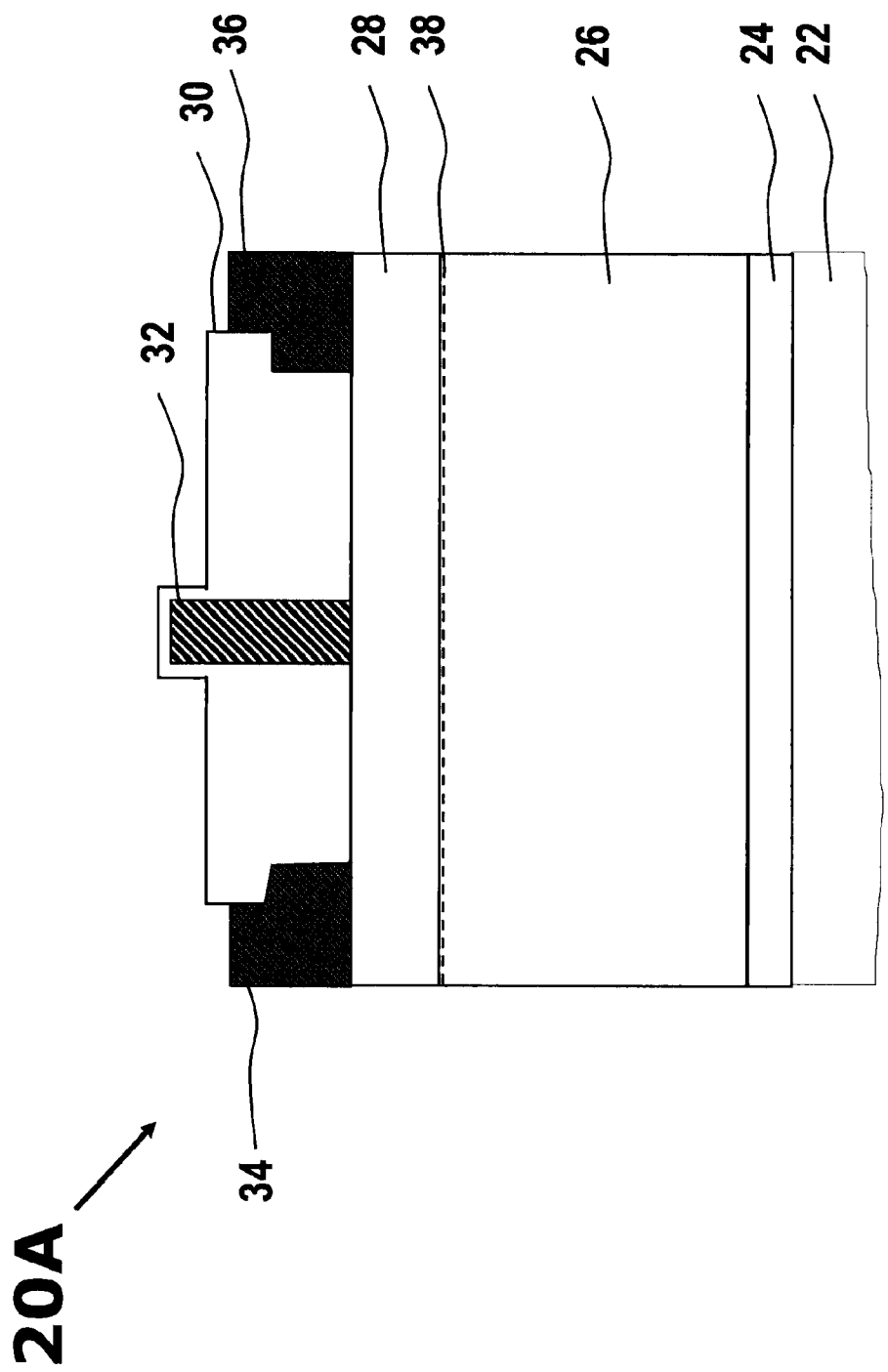
FIG. 1 illustrates an example of an AlN-barrier enhancement mode HEMT.

FIGS. 1-12 illustrate examples of structures and flow processes for group III-nitride enhancement mode field effect devices in which a two-dimensional electron gas is formed at or near the heterojunction between a group III-nitride barrier layer and an adjacent underlying group III-nitride semiconductor layer. In this context, group III-nitrides are nitrides from the InAlGaN system, including, for example, GaN, AlGaN, InGaN, AlN, InN and InAlGaN. In the structures described in greater detail below, the barrier layer, which serves as the second active layer, has a band gap wider than the band gap of the adjacent underlying layer, which serves as the first active layer. The barrier layer is thin enough that the two-dimensional electron gas is depleted if no additional material is disposed over the barrier layer. A gate contact, which is disposed between electrodes for the source and drain of the enhancement mode field effect device, is in direct contact with the barrier layer and selectively restores the two-dimensional electron gas beneath the gate when a positive voltage above a specified threshold is applied to the gate.

Ohmic contacts for the source and drain electrodes are in direct contact either with the barrier layer or with a group III-nitride semiconductor layer disposed over the barrier layer. Such structures can provide improved operational characteristics.

Between the source and drain, the two-dimensional electron gas is induced by providing one or more layers over the barrier layer. Depending on the particular structure, the top layer(s) over the second active layer (i.e., over the barrier layer) can also be used to improve the ohmic contacts. Preferably, the top layers over the barrier layer are lattice matched to the first active layer so as to reduce strain.

Preferably, the barrier layer is relatively thin, for example, on the order of less than five nanometers (nm). In this way, prior to growing top layers, the structure can have a very high resistance $R_{sh}$ (e.g., at least 4000Ω/□), and the two-dimensional electron gas is greatly depleted. The conductivity of the two-dimensional electron gas can be improved significantly by the addition of top layers over the barrier layer. The improved conductivity can result from a reduction of surface depletion or an increase of the two-dimensional electron gas sheet charge density because of the additional charge generated from the top layers, or a combination of these factors.

As the gate is in direct contact with the barrier layer, a region directly below the gate contact will be greatly depleted and have low conductivity under zero gate bias. Therefore, no deep recess into the barrier layer is required to achieve normally-off operation at zero gate bias. The stoichiometry of the top layers (i.e., the layers over the barrier layer) can be chosen to enable selective etching of those layers during formation of the opening for the gate contact. In this way, the barrier layer can serve as an etch-stop layer, with little or no recess being formed in the barrier layer.

FIG. 1 illustrates an example of an AlN-barrier enhancement mode HEMT 20A with ohmic contacts 34, 36 for the source and drain made directly to the AlN barrier layer 28. In this example, a nucleation layer 24 is provided over a SiC or other substrate 22. The AlN barrier layer 28 is provided on a semi-insulating GaN buffer layer 26, which is on the nucleation layer 24. The AlN layer 28, which serves as a second active layer, has a wider band gap than the underlying GaN buffer layer 26, which in this example serves as the first active layer. A passivation layer 30 is provided over the barrier layer 28 so that a two-dimensional electron gas 38 forms at or near the interface between the AlN barrier layer 28 and the underlying semi-insulating GaN buffer layer 26. The gate 32 contact is in direct contact with the barrier layer 28. The ohmic contacts 34, 36 for and source and drain also are in direct contact with the barrier layer 28. A passivation layer 30 can be deposited to protect the gate after the gate contact is formed.

Figure 2:
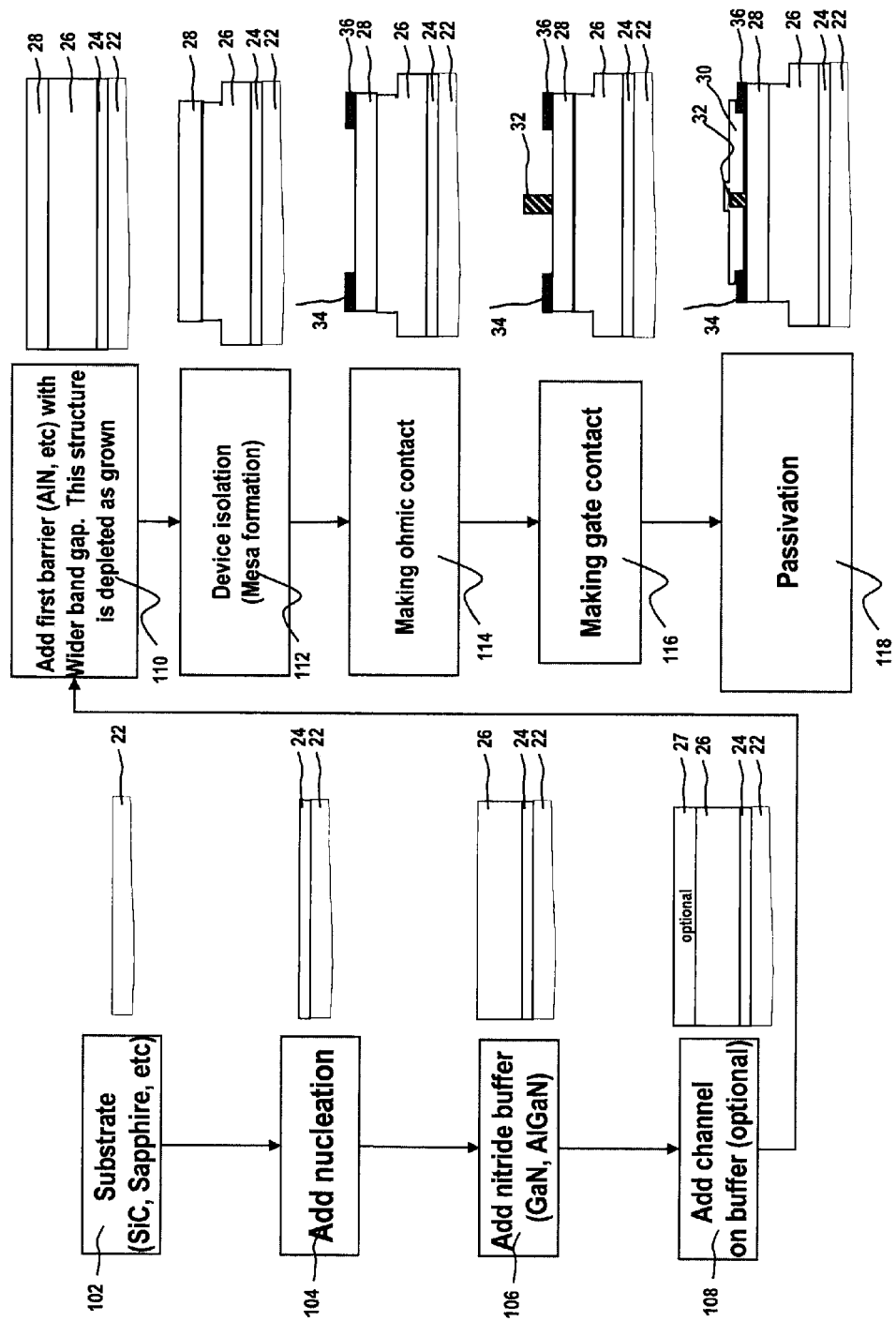
FIG. 2 illustrates an example flow process for fabricating the structure of FIG. 1.

FIG. 2 illustrates an example flow process for fabricating the device of FIG. 1. First, a substrate 22 (e.g., SiC or sapphire) is provided (block 102) and a nucleation layer 24 (e.g., AlN or AlGaN) is grown on the substrate (block 104). Next, a nitride buffer layer 26 (e.g., GaN or AlGaN) is grown on the nucleation layer 24 (block 106). In some cases, a channel layer 27 then is grown on the buffer layer 26 to enhance conductivity of the two-dimensional gas (block 108). The optional channel layer 27 can be, for example, InGaN or GaN. The barrier layer 28 should have a wider band gap than the adjacent underlying layer (i.e., the channel layer 27, if present, or the buffer layer 26 if there is no channel layer). After growth of the buffer layer 26 (and channel layer 27, if included), the first barrier layer 28 is grown (block 110). The layers 24, 26, 27, 28 can be grown, for example, using known epitaxial growth techniques such as metal organic vapor phase deposition (MOVPE) or molecular beam deposition (MBE). Other techniques can be used as well. After the epitaxial growth, the device area can be isolated by etching to at least below the interface of the layer 26 (and channel layer 27, if included) and layer 28. (block 112), and then the ohmic contacts 34, 36 are provided (block 114). After formation of the gate contact 32 (block 116) is completed, a passivation layer 30 is deposited (block 118).

The deposition and parameters of the passivation layer 30 are chosen such that the two-dimensional gas 38 is at or near the interface of the active layers. No current will flow between the source and drain when the gate is floating or grounded. However, applying a positive voltage above a particular threshold to the gate will induce a two-dimensional electron gas below the gate contact, allowing current to flow between the source and drain.

Figure 3:
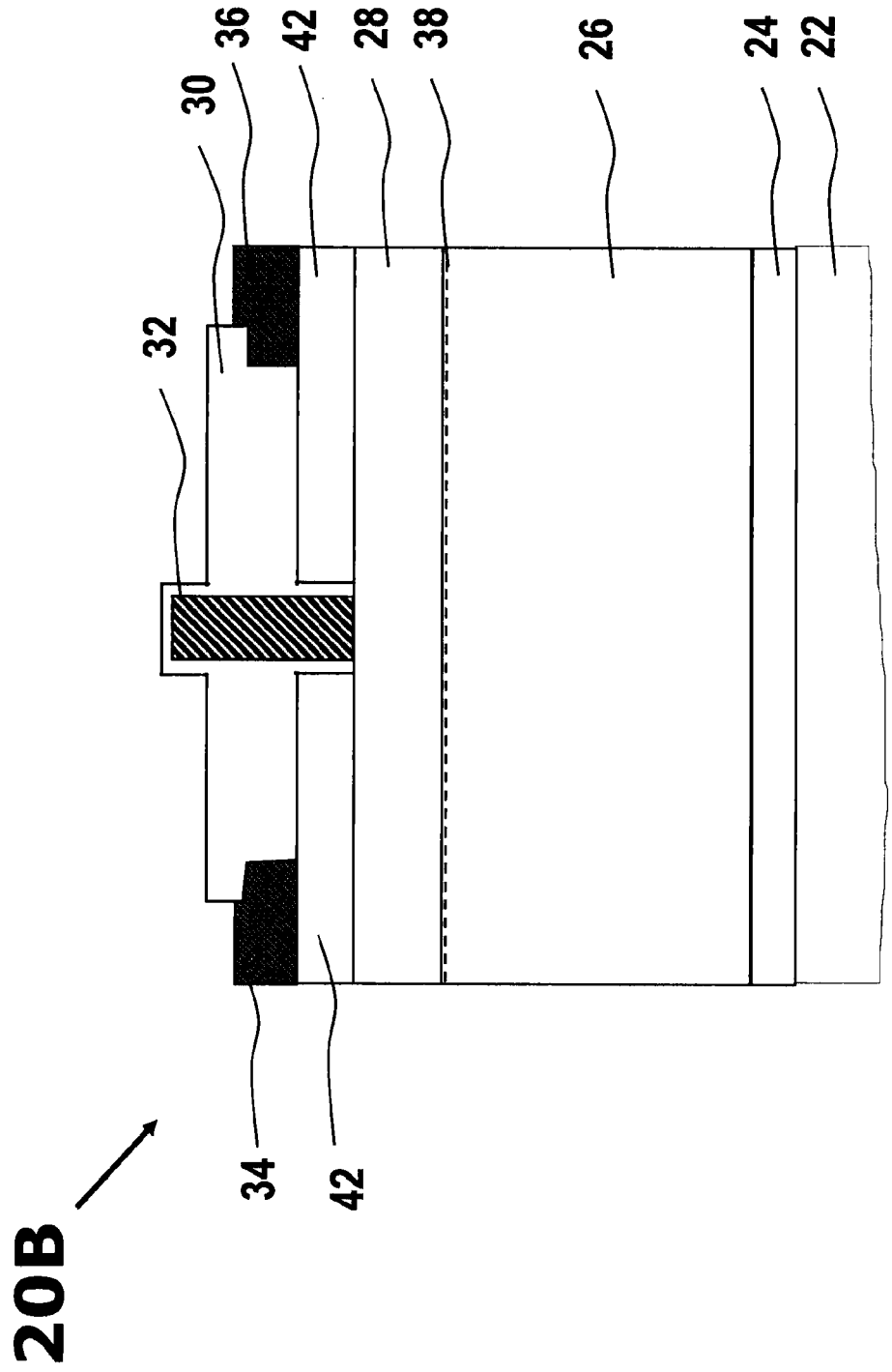
FIG. 3 illustrates another example of an AlN-barrier enhancement mode HEMT.

FIG. 3 illustrates an example of an AlN-barrier enhancement mode HEMT 20B with ohmic contacts 34, 36 for the source and drain made directly to a group III-nitride semiconductor layer 42 on the AlN barrier layer 28. As in the example of FIG. 1, a nucleation layer 24 is provided over a SiC or other substrate 22. The quantum-well structure for the two-dimensional electron gas includes the AlN barrier layer 28 on the semi-insulating GaN buffer layer 26, such that the two-dimensional electron gas 38 forms at or near the interface between the AlN barrier layer 28 and the underlying semi-insulating GaN buffer layer 26. The group III-nitride semiconductor layer 42 (e.g., GaN, InGaN or InN) is provided on the barrier layer 28, and a passivation layer 30 is provided over the group III-nitride semiconductor layer 42. The gate contact 32 extends through the semiconductor nitride layer 42 and is in direct contact with the barrier layer 28. The source and drain contacts 34, 36 are in direct contact with the group III-nitride semiconductor layer 42. A passivation layer 30 can be deposited to protect the gate after the gate contact is formed.

A process flow similar to that of FIG. 2 can be used to fabricate the structure of FIG. 3. In this case, however, after growing the barrier layer 28, the group III-nitride semiconductor layer 42 is grown, for example, using known epitaxial growth techniques.

Figure 4:
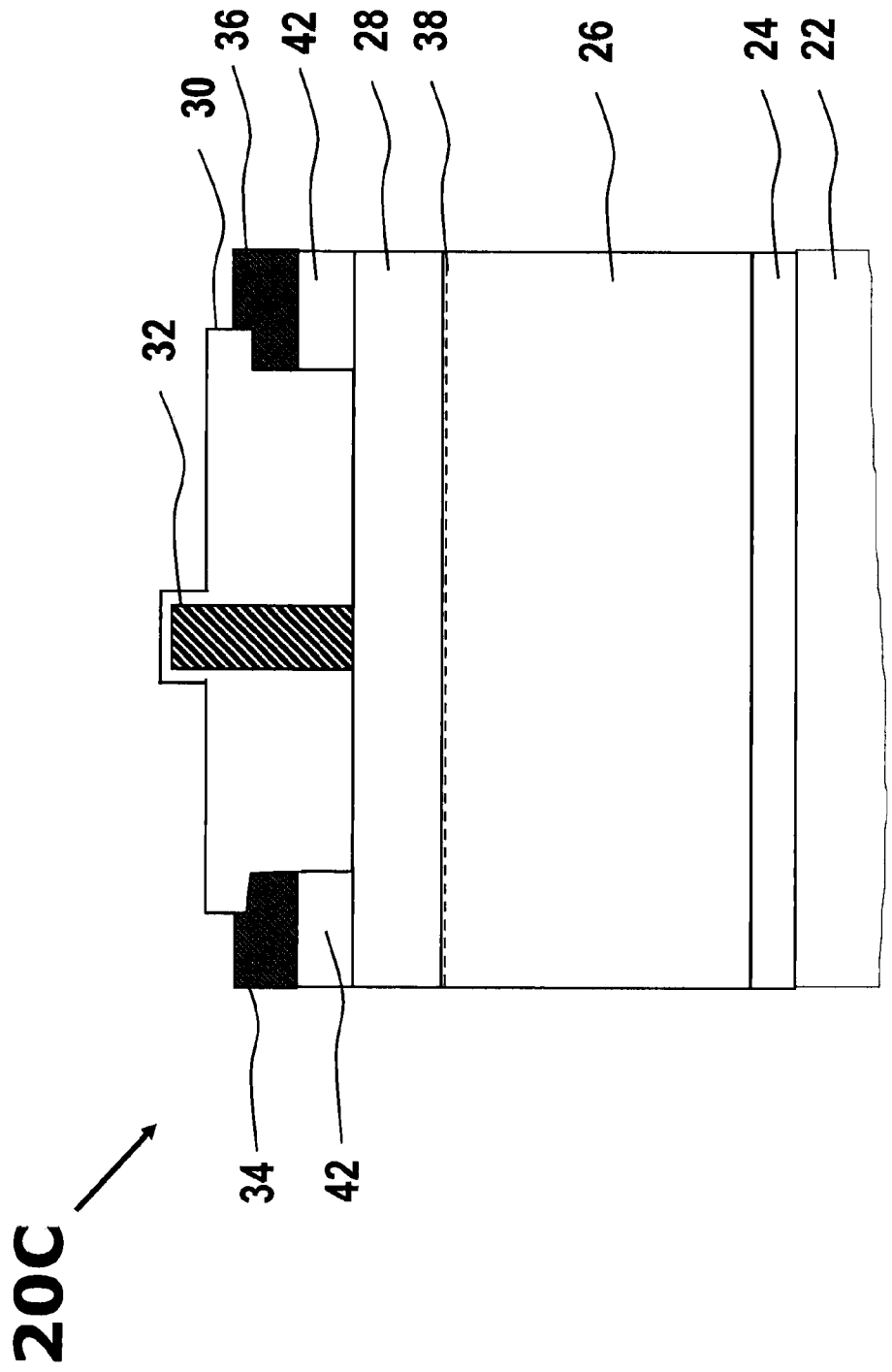
FIG. 4 illustrates a further example of an AlN-barrier enhancement mode HEMT.

FIG. 4 illustrates another example of an AlN-barrier enhancement mode HEMT 20C with ohmic contacts 34, 36 for the source and drain made directly to a group III-nitride semiconductor layer 42. However, in contrast to the structure of FIG. 3, the group III-nitride semiconductor layer 42 is substantially only under the source and drain electrodes 34, 36 and does not extend beneath the gate 32.

Figure 5:
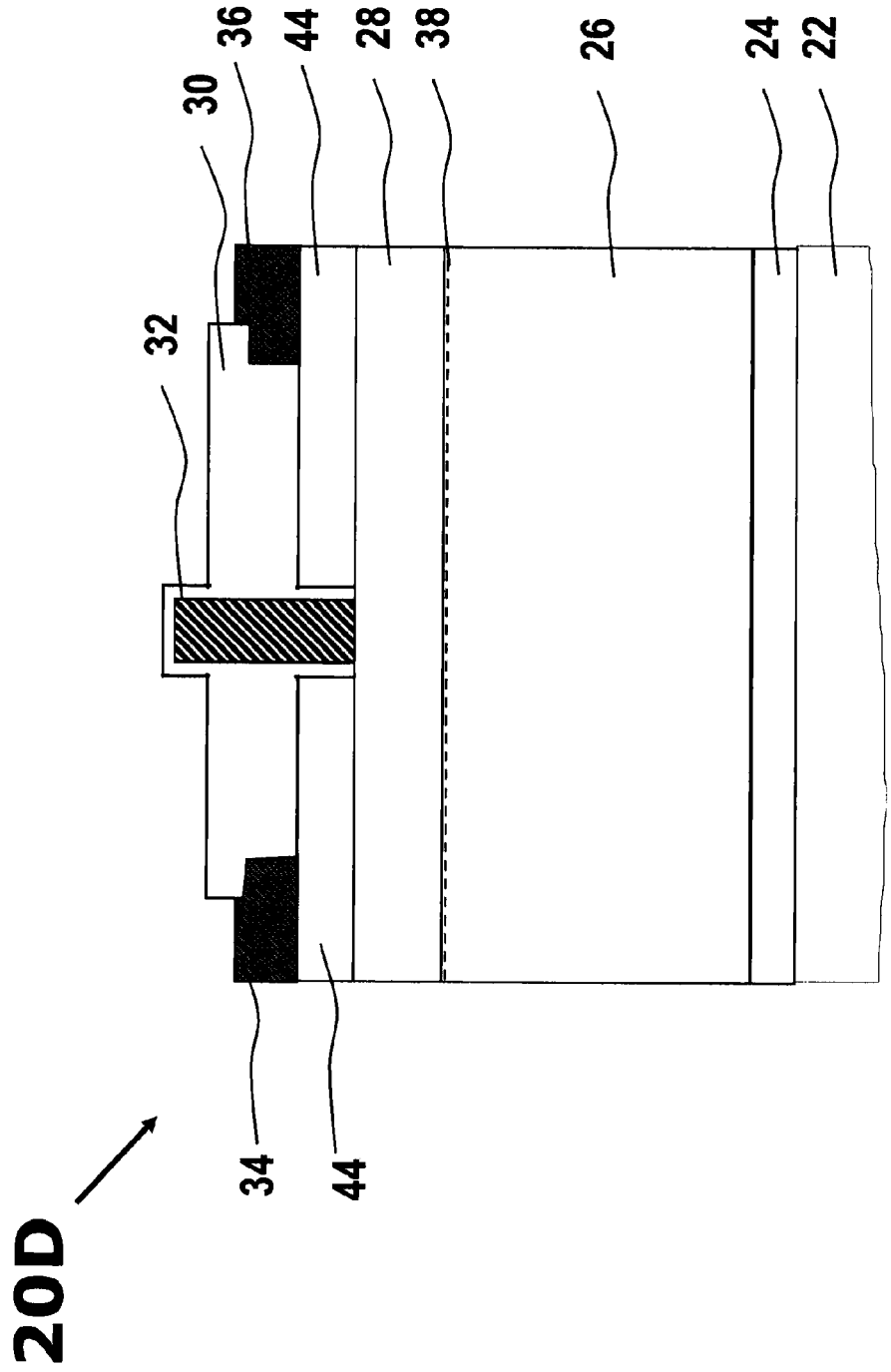
FIG. 5 illustrates an example of an AlInN/AlN-barrier enhancement mode HEMT.

FIG. 5 illustrates an example of an AlInN/AlN-barrier enhancement mode HEMT 20D with ohmic contacts 34, 36 for the source and drain made directly to the AlInN layer 44. As in the example of FIG. 1, a nucleation layer 24 is provided over a SiC or other substrate 22. The quantum-well structure for the two-dimensional electron gas includes AlN and AlInN barrier layers 28, 44 on a semi-insulating GaN buffer layer 26. The second barrier layer 44, which in this example is $Al_xIn_{1-x}N$ (0.17<x<0.18), is on the first barrier layer 28 and has a wider band gap than the semi-insulating GaN buffer layer 26, but a narrower band gap than the first barrier layer 28. The value of x in this example is chosen such that the $Al_xIn_{1-x}N$ barrier is close to lattice matched to the hexagonal (Wurtzite structure) GaN buffer. A lattice mismatched $Al_xIn_{1-x}N$ barrier to the buffer with other crystal structure such as cubic can also be used. The two-dimensional electron gas 38 forms at or near the interface between the first barrier layer 28 and the underlying semi-insulating GaN buffer layer 26. A passivation layer 30 is provided over the second barrier layer 44. The gate contact 32 extends through the second barrier layer 44 and is in direct contact with the first barrier layer 28. The source and drain contacts 34, 36 are in direct contact with the second barrier layer 44. A passivation layer 30 can be deposited to protect the gate after the gate contact is formed.

A process flow similar to that of FIG. 2 can be used to fabricate the structure of FIG. 5. In this case, however, after growing the first barrier layer 28, the second AlInN layer 44 is grown, for example, using known epitaxial growth techniques.

Figure 6:
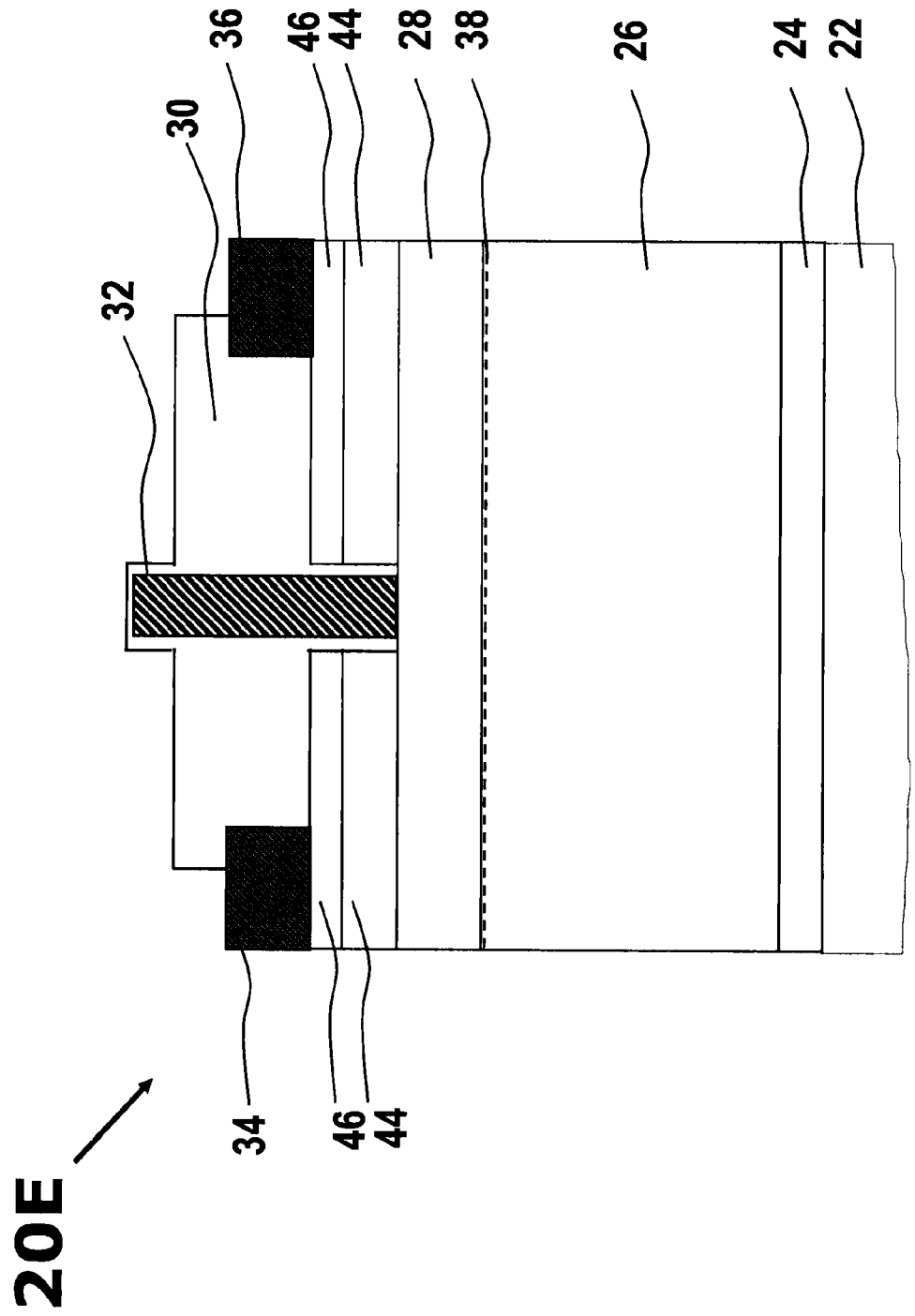
FIG. 6 illustrates another example of an AlInN/AlN-barrier enhancement mode HEMT.

FIG. 6 illustrates an example of an isolated AlInN/AlN-barrier enhancement mode HEMT 20E with ohmic contacts 34, 36 for the source and drain made directly to a group III-nitride semiconductor layer (e.g., GaN, InN, InGaN, AlInGaN) 46 disposed on the second barrier layer 44. In FIG. 6, the gate contact 32 extends through the group III-nitride layer 46 and the second barrier layer 44, and is in direct contact with the first barrier layer 28. A passivation layer 30 can be deposited after the gate contact is formed.

Figure 7:
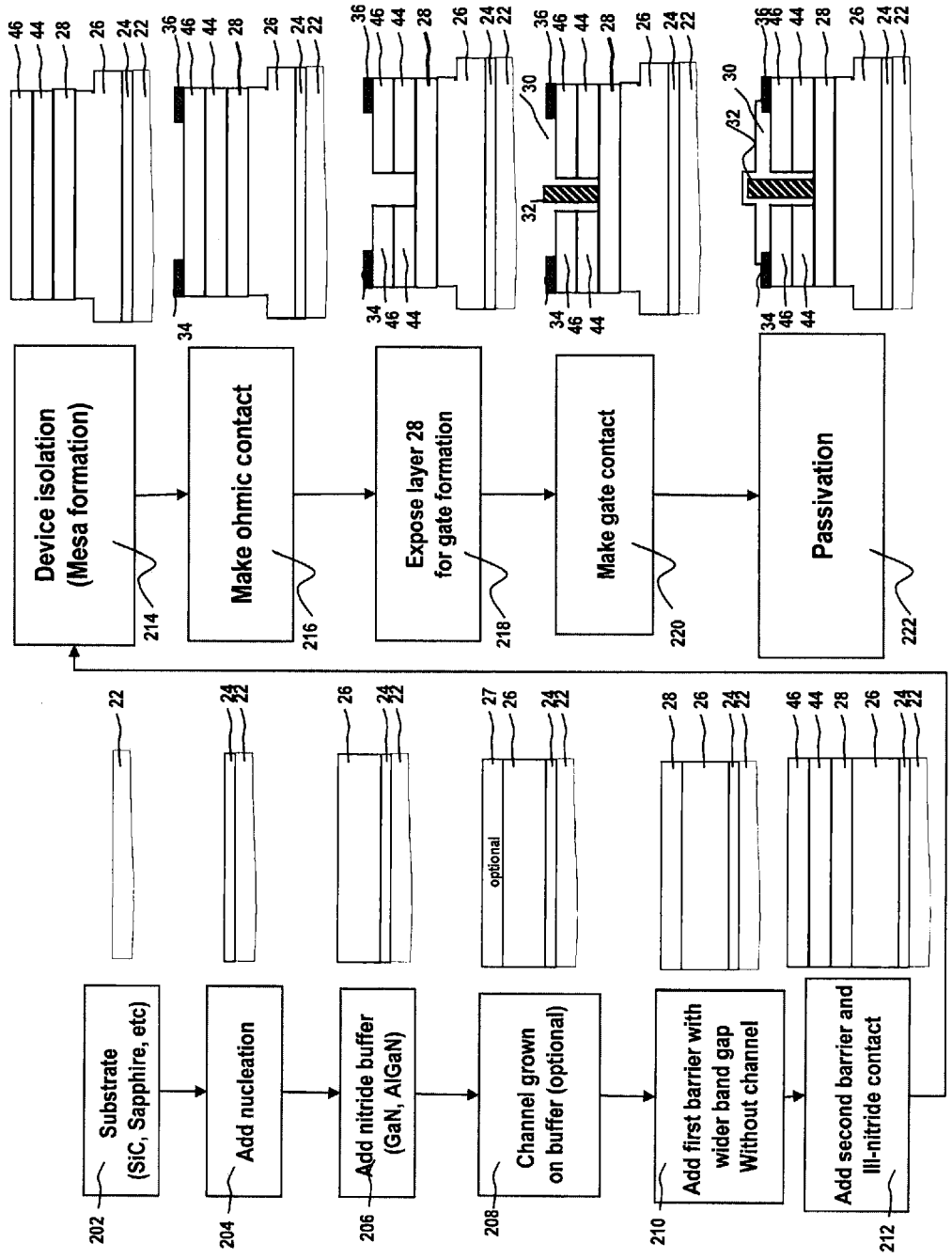
FIG. 7 illustrate a process flow for fabricating the structure of FIG. 6.
Figure 8:
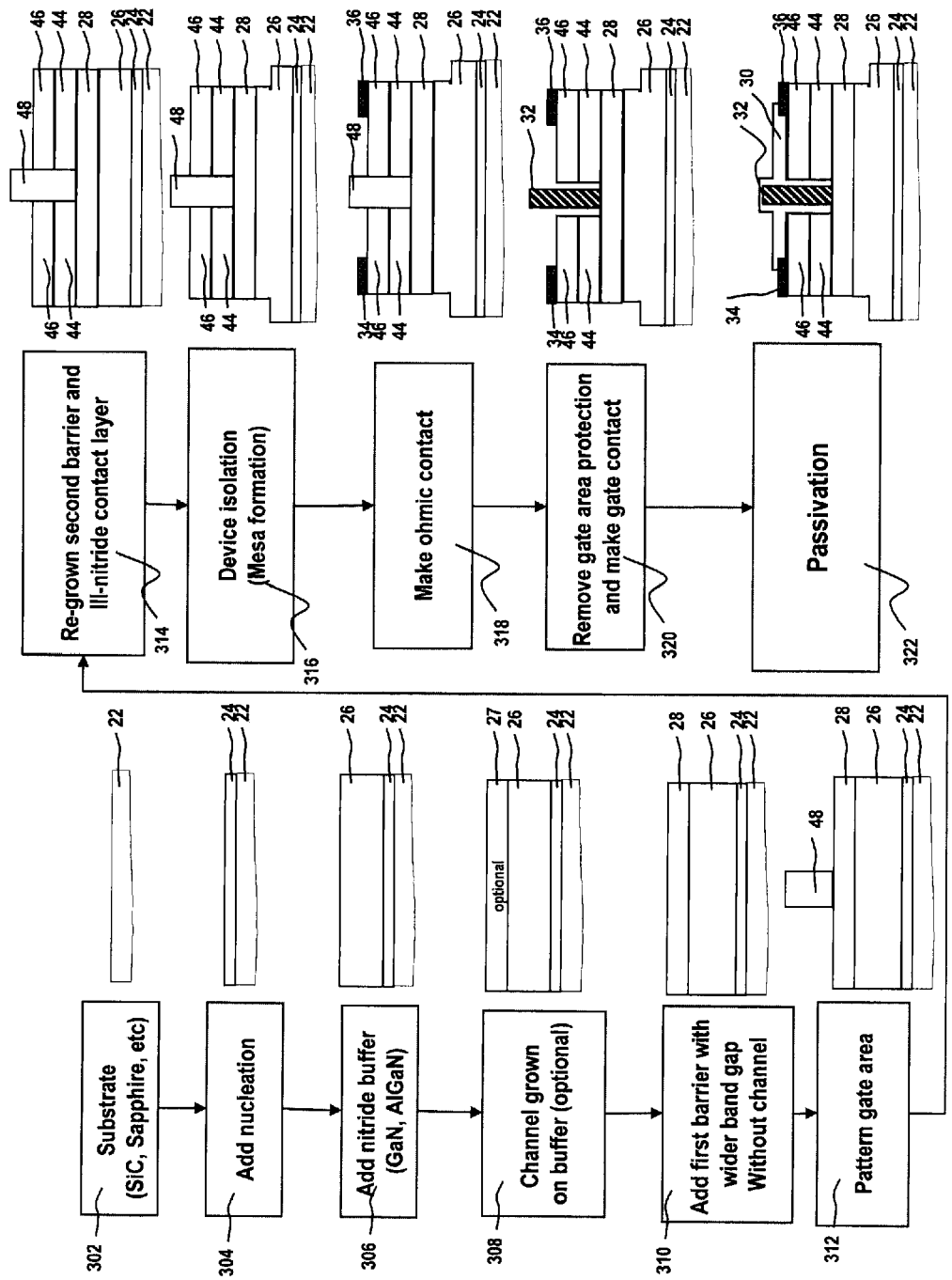
FIG. 8 illustrate another process flow for fabricating the structure of FIG. 6.

FIGS. 7 and 8 illustrate different process flows for fabricating the structure of FIG. 6. FIG. 7, for example, illustrates an etch-down process. Blocks 202, 204, 206, 208 and 210 of FIG. 7 are the same as the corresponding blocks 102, 104, 106, 108 and 110 in FIG. 2. At block 212, the second barrier layer 44 and the group III-nitride semiconductor layer (e.g., GaN, InGaN or InN) 46 are grown sequentially using, for example, known epitaxial growth techniques. After the epitaxial growth, the device area can be isolated by etching to at least below the interface of the layer 26 (and channel layer 27, if included) and layer 28. (block 214), and then the ohmic contacts 34, 36 are provided (block 216). By selective etching the top layers 46 and 44, the first barrier layer 28 is exposed for gate formation (block 218), and then the gate contact is made (block 220), followed by deposition of the passivation layer 30 (block 222).

FIG. 8 illustrates a build-up process for fabricating the structure of FIG. 6. Blocks 302, 304, 306, 308 and 310 are the same as the corresponding blocks 202, 204, 206, 208 and 210 in FIG. 7. At block 312, the gate area is patterned with a protective layer 48 (e.g., dielectric than can be wet-etched) that is not suitable for subsequent re-growth of the top layers. Next, the top layers (i.e., the second barrier layer 44 and the semiconductor layer 46) are re-grown (block 314), followed by isolating device area (block 316), and then ohmic contacts 34, 36 for the source and drain are provided (block 318). After removing the protective layer 48 over the gate area, the gate contact is formed on the barrier layer 28 (block 320). Whereas the flow process of FIG. 7 involves etching the top layers 44, 46 to form an opening for the gate contact 32, the flow process of FIG. 8 does not require such etching. Instead, in the flow process of FIG. 8, the top layers 44, 46 are formed after the protective layer 48 is deposited over the gate area, such that the opening for the gate contact already is present when the protective layer 48 is removed. A passivation layer 30 can be deposited after the gate contact is formed. (block 322).

Figure 9:
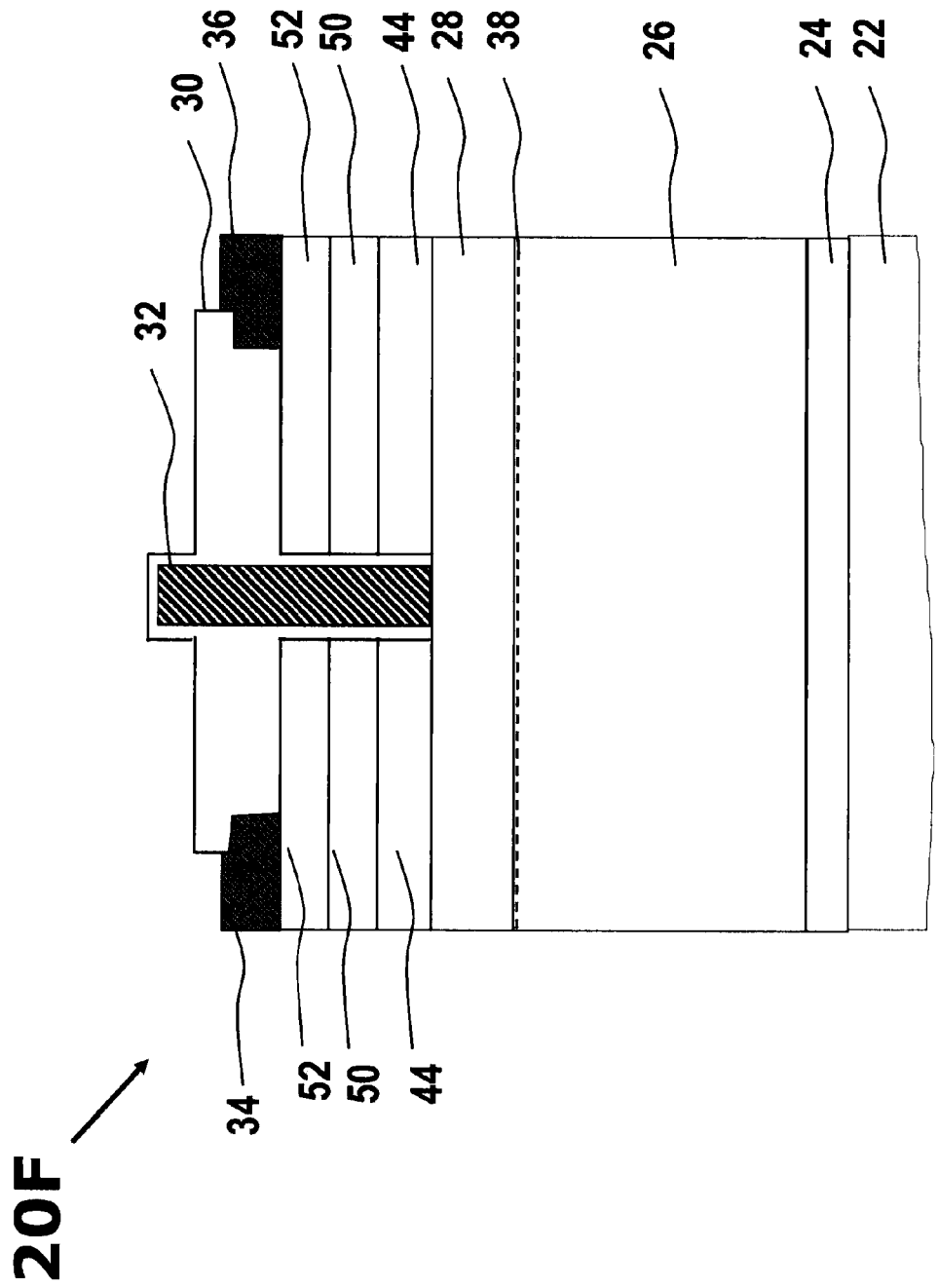
FIG. 9 illustrates a further example of an AlInN/AlN-barrier enhancement mode HEMT.

FIG. 9 illustrates an example of an AlInN/AlN-barrier enhancement mode HEMT 20F with ohmic contacts 34, 36 for the source and drain made directly to an InN layer 52. The HEMT 20F also includes a graded InGaN layer 50 disposed between the InN layer 52 and the second AlInN barrier layer 44. In FIG. 9, the gate contact 32 extends through layers 52, 50, 44 and is in direct contact with the first barrier layer 28. A passivation layer 30 can be deposited to protect the gate after the gate contact is formed.

A process flow similar to that of FIG. 7 or FIG. 8 can be used to fabricate the structure of FIG. 9. The graded InGaN and InN layers 50, 52 can be grown, for example, using known epitaxial growth techniques.

Figure 10:
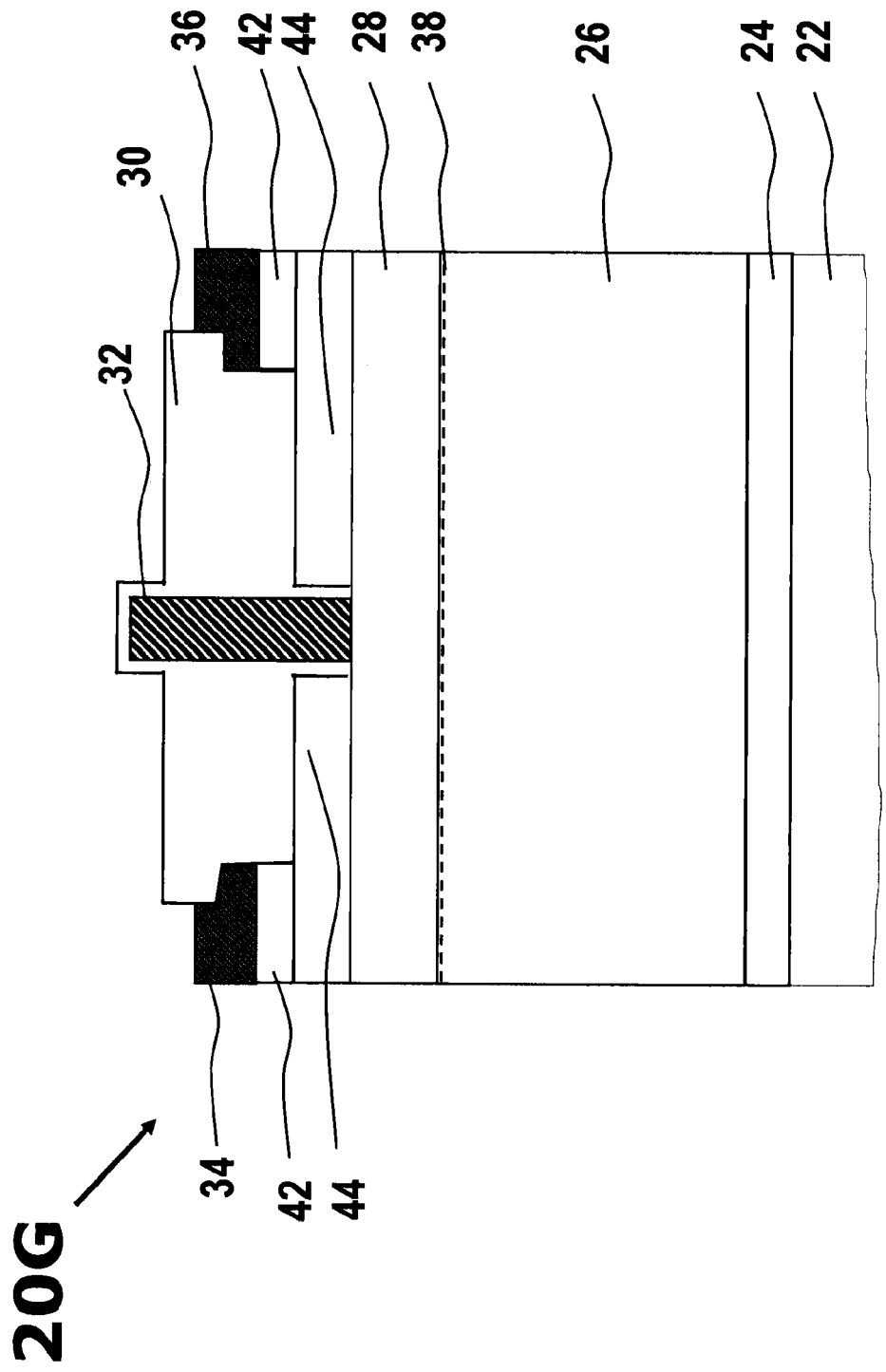
FIG. 10 illustrates yet another example of an AlInN/AlN-barrier enhancement mode HEMT.

FIG. 10 illustrates another example of an AlInN/AlN-barrier enhancement mode HEMT 20G. Like the structure of FIG. 6, ohmic contacts 34, 36 for the source and drain are made directly to a group III-nitride semiconductor layer (e.g., GaN, InN, InGaN, AlInGaN) 42, which is deposited over a second AlInN barrier layer 44. However, as in FIG. 4, the layer 42 is substantially only under the source and drain electrodes 34, 36 and does not extend beneath the gate 32. Also, a second AlInN barrier layer 44 is disposed between the passivation layer 30 and the first barrier layer 28 to enhance the two-dimensional electron gas 38. Here too, the gate contact 32 is in direct contact with the first barrier layer 28.

A structure similar to FIG. 10 can be also be made by replacing layer 42 with layer 50 and 52 in FIG. 9.

Figure 11:
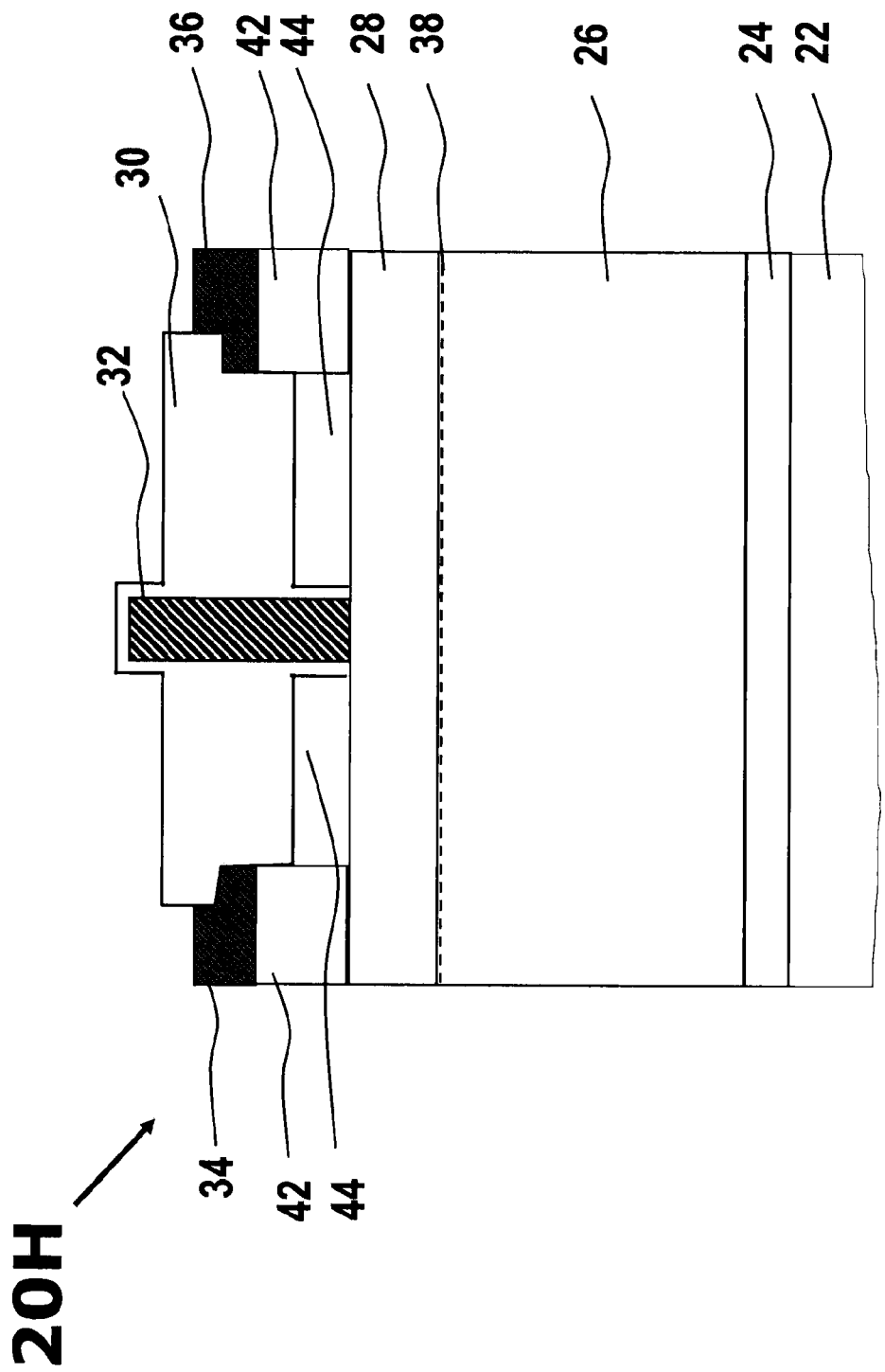
FIG. 11 illustrates yet another example of an AlInN/AlN-barrier enhancement mode HEMT.

FIG. 11 illustrates another example of an AlInN/AlN-barrier enhancement mode HEMT 20H. The difference between this structure and the structure in FIG. 10 is that the layer 42 is deposited directly on top of the first barrier layer 28.

Figure 12:
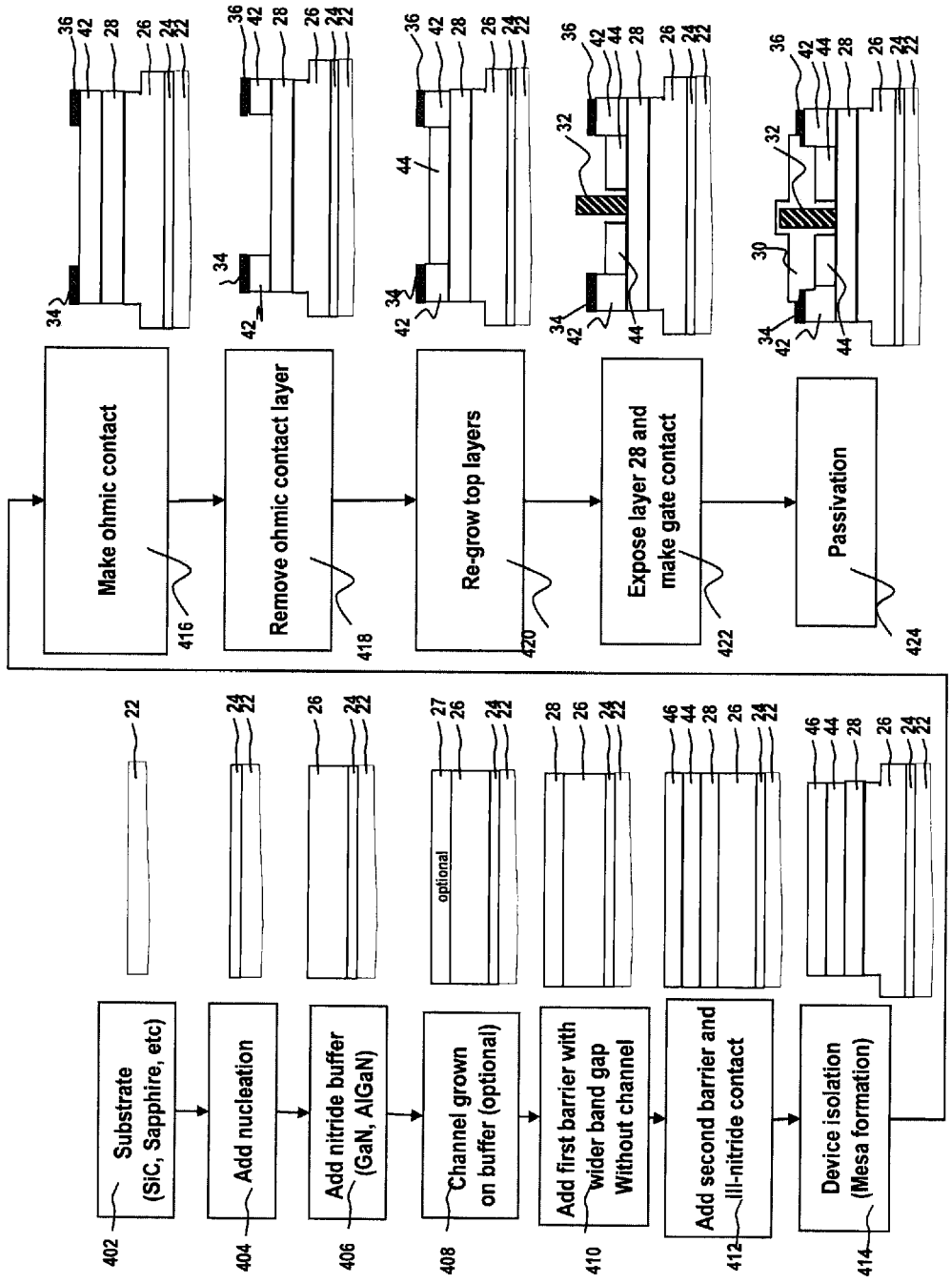
FIG. 12 illustrates a process flow for fabricating the structure of FIG. 11.

FIG. 12 illustrates a process flow for fabricating the structure of FIG. 11. Blocks 402, 404, 406, 408, 410, 412, 414 and 416 of FIG. 12 are the same as the corresponding blocks 202, 204, 206, 208, 210, 212, 214 and 216 in FIG. 7. After the ohmic contact in block 416, the ohmic contact layer 42 is removed from the area between the source and drain (block 418), and a second AlInN barrier layer 44 is deposited in the removed area of the ohmic contact layer 42 (block 420). Next, the second barrier layer 44 is etched selectively to form an opening for the gate contact to the first barrier layer 28 (block 422) and the passivation layer 30 is deposited (block 424).

Although the first barrier layer 28 in the foregoing examples is AlN, other wide band gap nitride layers (e.g., AlInGaN or AlInN) can be used as well. As mentioned above, the band gap of the first barrier layer 28 should be wider than the bang gap of the adjacent underlying layer (e.g., the channel layer 27, if present, or the buffer layer 26 if there is no channel layer). In situations where the ohmic contacts are not made directly to the first barrier layer 28, the band gap of the first barrier layer 28 also should be wider than the band gap of the ohmic contact layer 42. As noted above, examples of materials for the ohmic contact layer 42 include GaN, InN, InGaN, AlInGaN.

As also mentioned above, various layers can be provided, for example, using known epitaxial growth techniques such as metal organic vapor phase deposition (MOVPE) or molecular beam deposition (MBE). Other techniques can be used as well.

In some implementations, other layers may be present over the first group III-nitride barrier layer. In addition to the various group III-nitride layers and the passivation layer, such other layers can include, for example, dielectric layers (e.g., SiN, HfO and ITO) as well as layers of semi-metals (e.g., NiMnSb) or other materials (e.g., ZrN). The presence of other layers will depend on the desired electronic and other characteristics of the device.

The processes described above can be performed at the wafer level.

Other implementations are within the scope of the claims.

What is claimed is:

1. An enhancement mode field effect device comprising:
   a first active layer composed of a group III-nitride semiconductor layer;
   a second active layer composed of a group III-nitride barrier layer on the first active layer, wherein the second active layer has a band gap wider than the band gap of the first active layer;
   one or more overlayers disposed over the second active layer, wherein material composition of at least some of the one or more overlayers, including at least the overlayer closest to the second active layer, is different from material composition of the second active layer, wherein there is a two-dimensional electron gas at or near an interface between the first and second active layers and wherein the two-dimensional electron gas would not be present in the absence of the one or more overlayers;

a gate electrode extending through the one or more overlayers and in direct contact with the group III-nitride barrier layer of the second active layer, wherein the two-dimensional gas is not present directly under the gate electrode unless a positive voltage above a predetermined threshold is applied to the gate electrode; and source and drain electrodes in direct contact with a group III-nitride semiconductor layer.

2. The enhancement mode field effect device of claim 1 wherein the group III-nitride contact layer for source and drain contacts is the group III-nitride barrier layer of the second active layer.

3. The enhancement mode field effect device of claim 1 wherein the group III-nitride barrier layer of the second active layer is selected from a group consisting of AlN, AlInGaN and AlInN.

4. The enhancement mode field effect device of claim 3 wherein the thickness of the group III-nitride barrier layer of the second active layer is less than 5 nm.

5. The enhancement mode field effect device of claim 1 wherein one or more overlayers comprise a semiconductor ohmic contact layer with band gap narrower than the group III-nitride barrier layer of the second active layer.

6. The enhancement mode field effect device of claim 5 wherein the semiconductor ohmic contact layer comprises a group III-nitride.

7. The enhancement mode field effect device of claim 6 wherein the semiconductor nitride ohmic contact layer further comprises GaN, InGaN, InN, AlGaInN or AlInN.

8. The enhancement mode field effect device of claim 5 wherein the one or more overlayers further comprise a second group III-nitride barrier layer disposed directly on the group III-nitride barrier layer of the second active layer.

9. The enhancement mode field effect device of claim 8 wherein the second group III-nitride barrier layer extends beneath the ohmic contact layer.

10. The enhancement mode field effect device of claim 8 wherein the semiconductor ohmic contact layer comprises GaN, InGaN, InN, AlGaInN or AlInN, and wherein, if the ohmic contact layer is AlInN, the second group III-nitride barrier layer comprises AlInN with a higher Al percentage than the ohmic contact layer.

11. The enhancement mode field effect device of claim 10 wherein at least one of the overlayers is intentionally doped.

12. The enhancement mode field effect device of claim 8 wherein the second group III-nitride barrier layer is lattice matched to the buffer.

13. The enhancement mode field effect device of claim 8 wherein the one or more overlayers further comprise a graded semiconductor layer disposed between the semiconductor nitride ohmic contact layer and the second group III-nitride barrier layer.

14. The enhancement mode field effect device of claim 1 comprising a buffer layer below the second active layer.

15. The enhancement mode field effect device of claim 14 wherein the buffer layer is disposed over a nucleation layer and a substrate.

16. The enhancement mode field effect device of claim 14 wherein the first active layer is the buffer layer.

17. The enhancement mode field effect device of claim 14 wherein the buffer layer comprises GaN or AlGaN.

18. The enhancement mode field effect device of claim 14 wherein the buffer layer has a Wurtzite crystal structure.

19. The enhancement mode field effect device of claim 14 wherein the buffer layer has a cubic crystal structure.

20. The enhancement mode field effect device of claim 14 wherein the first active layer consists of the same stoichiometry as the buffer layer, but with a different level of dopant.

21. The enhancement mode field effect device of claim 14 wherein the first active layer is a nitride channel layer with narrower band gap than the buffer layer.

22. The enhancement mode field effect device of claim 21 wherein the channel layer comprises InGaN or GaN.

23. The enhancement mode field effect device of claim 1 wherein the one or more overlayers comprise a passivation layer.

24. The enhancement mode field effect device of claim 23 wherein the semiconductor nitride ohmic contact layer extends beneath the passivation layer.

25. The enhancement mode field effect device of claim 1 wherein the source and drain contact layer is disposed beneath the source and drain electrodes, but not beneath the overlayers.

26. A method of fabricating an enhancement mode field effect device, the method comprising:

providing first and second active layers that form a heterojunction, wherein the first active layer is composed of a group III- semiconductor layer. and the second active layer is composed of a group III-nitride barrier disposed on the first active layer, wherein the second active layer has a band gap wider than a band gap of the first active layer; growing one or more semiconductor nitride layers over the second active layer, wherein the one or more layers include a semiconductor nitride ohmic contact layer;

providing source and drain electrodes in direct contact with the semiconductor nitride ohmic contact layer;

selectively removing portions of the semiconductor nitride layers to define an overlayer opening in an area between the source and drain electrodes and not covered by the source and drain electrodes;

growing one or more overlayers in the overlayer opening;

selectively etching through the overlayers to form a gate contact opening for a gate contact, wherein a bottom of the gate contact opening is substantially at a top surface of the group III-nitride barrier layer of the second active layer; and forming a gate contact that extends through the gate contact opening such that the gate contact is in direct contact with the group III-nitride barrier layer of the second active layer.

27. The method of claim 26 wherein:

the first group III-nitride barrier layer of the second active layer comprises a material selected from a group consisting of AlN, AlInGaN, AlGaN and AlInN;

the first active layer comprises a buffer layer or a channel layer;

the semiconductor nitride ohmic contact layer comprises a material selected from a group consisting of GaN, InGaN, InN, AlGaInN and AlInN; and each of the first active layer, the second active layer, the second semiconductor group III-nitride barrier layer and the semiconductor nitride ohmic contact layer is grown by an epitaxial growth process.

28. The method of claim 26 further including isolating a device area that includes the source, drain and gate.

29. The method of claim 26 wherein isolation is achieved by a mesa etch from the overlayers towards the buffer, with a depth at least below the interface of the first and second active layers.

30. The method of claim 26 further including a passivation step.

31. The method of claim 26 wherein the overlayer opening exposes the first group III-nitride barrier of the second active layer.

32. The method of claim 26 wherein the overlayer opening exposes at least a portion of the second group III-nitride barrier.

33. The method of claim 26 wherein the one or more overlayers comprise only a passivation layer.

34. A method of fabricating an enhancement mode field effect device, the method comprising:
providing a first active layer composed of a group III-semiconductor layer;
growing a semiconductor nitride ohmic contact layer;
providing source and drain electrodes in direct contact with the semiconductor nitride ohmic contact layer;
selectively removing portions of the semiconductor nitride ohmic contact layer to define a barrier opening in an area between the source and drain electrodes and not covered by the source and drain electrodes;
growing a second active layer in the barrier opening;
further growing one or more overlayers disposed over the second active layer in the same barrier opening;
selectively etching through the overlayers to form a gate contact opening for a gate contact, wherein a bottom of the gate contact opening is substantially at a top surface of the group III-nitride barrier layer of the second active layer; and
forming a gate contact that extends through the gate contact opening such that the gate contact is in direct contact with the group III-nitride barrier layer of the second active layer.

35. The method of claim 34 wherein:
the first group III-nitride barrier layer of the second active layer comprises a material selected from a group consisting of AlN, AlInGaN, AlGaN and AlInN;
the first active layer comprises a buffer layer or a channel layer;
the semiconductor nitride ohmic contact layer comprises a material selected from a group consisting of GaN, InGaN, InN, AlGaInN and AlInN; and
each of the first active layer, the second active layer, the second semiconductor group III-nitride barrier layer and the semiconductor nitride ohmic contact layer is grown by an epitaxial growth process.

36. The method of claim 34 further including isolating a device area that includes the source, drain and gate.

37. The method of claim 34 wherein isolation is achieved by a mesa etch from the overlayers towards the buffer, with a depth at least below the interface of the first and second active layers.

38. The method of claim 34 further including a passivation step.

39. The method of claim 34 wherein the overlayer opening exposes the first group III-nitride barrier of the second active layer.

40. The method of claim 34 wherein the overlayer opening exposes at least a portion of the second group III-nitride barrier.

41. The method of claim 34 wherein the one or more overlayers comprise only a passivation layer.

42. An enhancement mode field effect device comprising:
a first active layer composed of a group III-nitride semiconductor layer;
a second active layer composed of a group III-nitride barrier layer on the first active layer, wherein the second active layer has a band gap wider than the band gap of the first active layer;
one or more overlayers disposed over the second active layer, wherein material composition of at least some of the one or more overlayers, including at least the overlayer closest to the second active layer, is different from material composition of the second active layer, and wherein a thickness of the group III-nitride barrier layer of the second active layer is sufficiently thin that, in the absence of the one or more overlayers, the first and second active layers have a resistance of at least 4000 $\Omega/\square$;
a gate electrode extending through the one or more overlayers and in direct contact with the group III-nitride barrier layer of the second active layer, wherein there is no two-dimensional gas present directly under the gate electrode unless a positive voltage above a predetermined threshold is applied to the gate electrode; and
source and drain electrodes in direct contact with a group III-nitride semiconductor layer.

43. The enhancement mode field effect device of claim 42 wherein the group III-nitride contact layer for source and drain contacts is the group III-nitride barrier layer of the second active layer.

44. The enhancement mode field effect device of claim 42 wherein the group III-nitride barrier layer of the second active layer is selected from a group consisting of AlN, AlInGaN and AlInN.

45. The enhancement mode field effect device of claim 42 wherein the thickness of the group III-nitride barrier layer of the second active layer is less than 5 nm.

46. The enhancement mode field effect device of claim 42 wherein one or more overlayers comprise a semiconductor ohmic contact layer with band gap narrower than the group III-nitride barrier layer of the second active layer.

47. The enhancement mode field effect device of claim 46 wherein the one or more overlayers further comprise a second group III-nitride barrier layer disposed directly on the group III-nitride barrier layer of the second active layer.

48. The enhancement mode field effect device of claim 47 wherein the second group III-nitride barrier layer extends beneath the ohmic contact layer.

49. The enhancement mode field effect device of claim 47 wherein the semiconductor ohmic contact layer comprises GaN, InGaN, InN, AlGaInN or AlInN, and wherein, if the ohmic contact layer is AlInN, the second group III-nitride barrier layer comprises AlInN with a higher Al percentage than the ohmic contact layer.

50. The enhancement mode field effect device of claim 49 wherein at least one of the overlayers is intentionally doped.

51. The enhancement mode field effect device of claim 47 wherein the second group III-nitride barrier layer is lattice matched to the buffer.

52. The enhancement mode field effect device of claim 47 wherein the one or more overlayers further comprise a graded semiconductor layer disposed between the semiconductor nitride ohmic contact layer and the second group III-nitride barrier layer.

53. The enhancement mode field effect device of claim 46 wherein the semiconductor ohmic contact layer comprises a group III-nitride.

54. The enhancement mode field effect device of claim 53 wherein the semiconductor nitride ohmic contact layer further comprises GaN, InGaN, InN, AlGaInN or AlInN.

55. The enhancement mode field effect device of claim 42 comprising a buffer layer below the second active layer.

56. The enhancement mode field effect device of claim 55 wherein the buffer layer is disposed over a nucleation layer and a substrate.

57. The enhancement mode field effect device of claim 55 wherein the first active layer is the buffer layer.

58. The enhancement mode field effect device of claim 55 wherein the buffer layer comprises GaN or AlGaN.

59. The enhancement mode field effect device of claim 55 wherein the buffer layer has a Wurtzite crystal structure.

60. The enhancement mode field effect device of claim 55 wherein the buffer layer has a cubic crystal structure.

61. The enhancement mode field effect device of claim 55 wherein the first active layer consists of the same stoichiometry as the buffer layer, but with a different level of dopant.

62. The enhancement mode field effect device of claim 55 wherein the first active layer is a nitride channel layer with narrower band gap than the buffer layer.

63. The enhancement mode field effect device of claim 62 wherein the channel layer comprises InGaN or GaN.

64. The enhancement mode field effect device of claim 42 wherein the one or more overlayers comprise a passivation layer.

65. The enhancement mode field effect device of claim 64 wherein the semiconductor nitride ohmic contact layer extends beneath the passivation layer.

66. The enhancement mode field effect device of claim 42 wherein a source and drain contact layer is disposed beneath the source and drain electrodes, but not beneath the overlayers.

67. An enhancement mode field effect device comprising:
a first active layer composed of a group III-nitride semiconductor layer;
a second active layer composed of a group III-nitride barrier layer on the first active layer, wherein the second active layer has a band gap wider than the band gap of the first active layer;
one or more overlayers disposed over the second active layer, wherein material composition of at least some of the one or more overlayers, including at least the overlayer closest to the second active layer, is different from material composition of the second active layer, and wherein a thickness of the group III-nitride barrier layer of the second active layer is sufficiently thin that, in the absence of the one or more overlayers, the first and second active layers have a resistance of at least $4000\Omega$;
a gate electrode extending through the one or more overlayers and in direct contact with the group III-nitride barrier layer of the second active layer, wherein application to the gate electrode of a voltage above a predetermined threshold selectively restores a two-dimensional electron gas directly under the gate electrode; and
source and drain electrodes in direct contact with a group III-nitride semiconductor layer.

* * * * *

UNITED STATES PATENT AND TRADEMARK OFFICE
CERTIFICATE OF CORRECTION

PATENT NO.        : 8,344,421 B2
APPLICATION NO.   : 12/778011
DATED             : January 1, 2013
INVENTOR(S)       : Xiang Gao and Shiping Guo It is certified that error appears in the above-identified patent and that said Letters Patent is hereby corrected as shown below:

Column 7, line 49 (Claim 10, line 5) delete "A 1 InN" and insert --AlInN--.

Column 10, line 2 (Claim 42, line 2) delete "HI-nitride" and insert --III-nitride--.

Signed and Sealed this
Twenty-sixth Day of March, 2013

Teresa Stanek Rea
*Acting Director of the United States Patent and Trademark Office*